United States Patent
Nguyen et al.

(10) Patent No.: US 12,154,645 B2
(45) Date of Patent: *Nov. 26, 2024

(54) PULSE DETECTION IN MICROELECTRONIC DEVICES, AND RELATED DEVICES, SYSTEMS, AND METHODS

(71) Applicant: Micron Technology, Inc., Boise, ID (US)

(72) Inventors: Linh H. Nguyen, Boise, ID (US); Diana C. Majerus, Boise, ID (US); Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/363,587

(22) Filed: Aug. 1, 2023

(65) Prior Publication Data
US 2023/0377675 A1 Nov. 23, 2023

Related U.S. Application Data

(63) Continuation of application No. 17/129,596, filed on Dec. 21, 2020, now Pat. No. 11,721,410.

(51) Int. Cl.
*G11C 29/00* (2006.01)
*G11C 29/50* (2006.01)
*H03K 19/20* (2006.01)

(52) U.S. Cl.
CPC ............ *G11C 29/50* (2013.01); *H03K 19/20* (2013.01)

(58) Field of Classification Search
CPC ............ G11C 29/50; G11C 29/50004; G11C 29/50008; G11C 29/50012; G11C 29/50016; H03K 19/20; H03K 19/21
See application file for complete search history.

(56) References Cited

U.S. PATENT DOCUMENTS

| | | | |
|---|---|---|---|
| 6,633,527 B1 | 10/2003 | Kim | |
| 9,692,417 B1 | 6/2017 | Rezayee et al. | |
| 10,466,275 B1 | 11/2019 | Vundavalli et al. | |
| 11,721,410 B2 * | 8/2023 | Nguyen | G11C 29/50012 714/721 |
| 2004/0119227 A1 | 6/2004 | Duncan et al. | |
| 2020/0402602 A1 * | 12/2020 | Mahatme | G11C 29/021 |
| 2021/0396789 A1 | 12/2021 | Lentz et al. | |
| 2022/0382322 A1 * | 12/2022 | Sinha | G06F 1/14 |

\* cited by examiner

*Primary Examiner* — Christine T. Tu
(74) *Attorney, Agent, or Firm* — TraskBritt

(57) ABSTRACT

Pulse detection in microelectronic devices, and related methods, devices, and systems, are described herein. A device may detect and compare a number of pulses of a signal to a timing aperture to determine if any of the number of pulses is unacceptable. The timing aperture, which may be based on a timing signal and/or one or more pulse width thresholds, may define an acceptable pulse versus an unacceptable pulse.

20 Claims, 13 Drawing Sheets

PULSE DETECTION IN MICROELECTRONIC DEVICES, AND RELATED DEVICES, SYSTEMS, AND METHODS

CROSS-REFERENCE TO RELATED APPLICATION

This application is a continuation of U.S. patent application Ser. No. 17/129,596, filed Dec. 21, 2020, now U.S. Pat. No. 11,721,410, issued on Aug. 8, 2023, the disclosure of which is hereby incorporated herein in its entirety by this reference.

TECHNICAL FIELD

Embodiments of the disclosure relate to glitch detection. Yet more specifically, various embodiments of the disclosure relate to glitch detection in microelectronic devices, and related methods, devices, and systems.

BACKGROUND

Memory devices are typically provided as internal, semiconductor-based, integrated circuits in computers or other electronic systems. There are many different types of memory including, for example, random-access memory (RAM), read-only memory (ROM), dynamic random-access memory (DRAM), synchronous dynamic random-access memory (SDRAM), resistive random-access memory (RRAM), double-data rate memory (DDR), low-power double-data rate memory (LPDDR), phase-change memory (PCM), and Flash memory.

DETAILED DESCRIPTION

Figure 1:
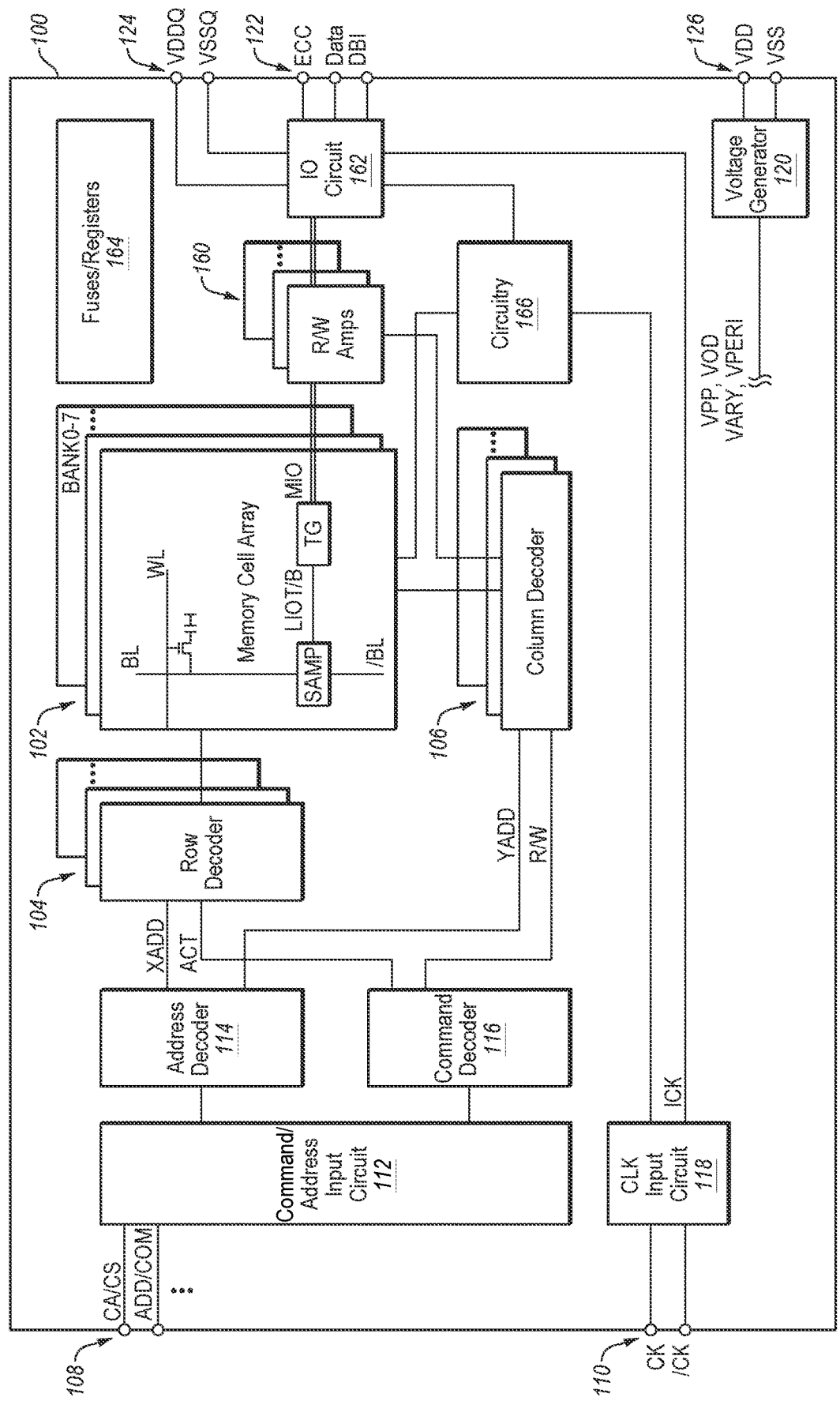
FIG. 1 is a functional block diagram of an example memory device, according to various embodiments of the present disclosure.

A semiconductor memory device typically includes an array of memory cells. Memory cells in the array are selected for reading and writing by means of row and column address signals input to the memory device. The row and column address signals are processed by address decoding circuitry to select row lines and column lines in the array to access the desired memory cell or memory cells. As described in more detail below, various signals, such as address signals, command signals (e.g., active commands, read/write signals, refresh commands, without limitation), data signals, strobe signals, and other signals, may be conveyed within a semiconductor memory device. These and other signals may include pulses (i.e., changes in amplitude) of a signal from a baseline value to another value (i.e., a higher or lower value) and back to the baseline value. As described herein, a pulse of a signal having a width that is either too short (e.g., less than one-fourth of a clock cycle) or too long (e.g., more than three-fourths of a clock cycle) may be due to a fault and/or a design error, which may affect various functions (e.g., commands, read and/or write operations, without limitation) and/or result in a malfunction of an associated device.

As will be appreciated, some signal pulses (e.g., short pulses) in a circuit (e.g., a microelectronic circuit, such a semiconductor circuit) can cause non-deterministic behavior. As will be appreciated, various issues and/or events (e.g., a temporary metastable state (e.g., due to a timing hazard to a flip-flop (FF)) or latch) and/or asynchronous or poorly-controlled timing of signals entering a logic gate may cause a downstream short pulse or "glitch" (e.g., in the semiconductor circuit).

As will be also appreciated, semiconductor devices may be simulated and/or tested (e.g., by design and/or verification personnel) in an ideal environment, and therefore it may be difficult to detect many unexpected on-die glitches. Also, in some conventional systems and/or methods, glitch issues are identified during system testing (e.g., close in time to customer shipping), which may undesirably increase time to market (TTM) (i.e., due to required debugging and/or additional simulation and compute validation processes).

As disclosed herein, various embodiments may relate to detecting glitches within semiconductor devices. More specifically, for example, in some embodiments, a signal (e.g., a "test signal," a "signal of interest" or a "signal under test") may be monitored to determine if any pulses of the signal are a glitch. According to various embodiments, a width of a pulse of a signal may be detected and compared against a selectable range of widths (also referred to herein as a "timing aperture" or a "timing window") to determine whether or not the pulse is a glitch. According to some embodiments, the timing aperture may be set (e.g., by a user) via, for example, one or more fuses (e.g., test mode fuse).

More specifically, according to one non-limiting example, a width of a pulse of a data strobe signal (DQS) may be detected and compared against a timing signal (e.g., a pulse and/or a clock signal (e.g., a system clock signal)) that may define and/or may be used to define a timing aperture. In at least some embodiments, a timing aperture may be selected to be between, for example, one-fourth of a period of a clock signal and three-fourths of a period of a clock signal. In this example, if a width of pulse of a DQS signal is less than one-fourth of a period of the clock signal or greater than three-fourths of a period of the clock signal, the pulse may be determined to be a problematic glitch. Otherwise, the pulse may be determined to be an acceptable pulse. As another example, if a width of pulse of a DQS signal is less than one-half of a period of the clock signal or greater than one-half of a period of the clock signal, the pulse may be determined to be a problematic glitch. In yet another example, if a width of pulse of a DQS signal is less than one-half of a period of the clock signal or greater than three-fourths of a period of the clock signal, the pulse may be determined to be a problematic glitch.

In some embodiments, in response to detection of a glitch, an indication (e.g., a warning) of the glitch may be provided. More specifically, an alert pin, or another available pin of a semiconductor device, may be used to indicate a detected glitch. Moreover, according to some embodiments, one or more operations (e.g., enabling and/or disabling events) may be performed in response to detection of a glitch. For example, in response to detection of a glitch (e.g., of a DQS signal) in a semiconductor device, one or more input/output operations may be performed and/or modified based on one or more pre-defined mode register settings of the semiconductor device. Yet more specifically, for example, one or more mode register settings may be configured such that one or more read and/or write operations are disabled in response to detection of a glitch. More specifically, for example, one or more mode register bits may be configured such that if a DQS signal associated with a write operation includes a glitch, the write operation may be blocked. As another example, one or more mode register bits may be configured such that if a DQS signal associated with a write operation includes a glitch, an associated read operation (i.e., for reading data associated with the write operation), may be disabled (i.e., via a read block). In another example, one or more mode register bits may be configured such that if a DQS signal associated with a write operation includes a glitch, the write operation and an associated read operation (i.e., for reading data associated with the write operation) may be allowed (e.g., to compare data of the write with data of the read).

As will be appreciated, various embodiments of the present disclosure may assist in validation of in-silicon function and performance. As will also be appreciated, various embodiments may enable some issues (e.g., glitch/ringing issues) to be identified at component level (i.e., prior to system testing), and thus may reduce an amount of subsequent testing (e.g., debugging and/or additional simulation and compute validation processes).

Although various embodiments are described herein with reference to semiconductor and/or memory devices, the present disclosure is not so limited, and the embodiments may be generally applicable to microelectronic systems and/or devices that may or may not include semiconductor devices and/or memory devices. Embodiments of the present disclosure will now be explained with reference to the accompanying drawings.

FIG. 1 is a functional block diagram illustrating an example memory device 100, in accordance with at least one embodiment of the present disclosure. Memory device 100 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). Memory device 100, which may be integrated on a semiconductor chip, may include a memory cell array 102.

In the embodiment of FIG. 1, memory cell array 102 is shown as including eight memory banks BANK0-7. More or fewer banks may be included in memory cell array 102 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 104 and the selection of the bit lines BL and /BL may be performed by a column decoder 106. In the embodiment of FIG. 1, row decoder 104 may include a respective row decoder for each memory bank BANK0-7, and column decoder 106 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 160 over complementary local data lines (LIOT/B), a transfer gate (TG), and complementary main data lines (MIOT/B). Conversely, write data outputted from read/write amplifiers 160 may be transferred to sense amplifier SAMP over complementary main data lines MIOT/B, transfer gate TG, and complementary local data lines LIOT/B, and written in memory cell MC coupled to bit line BL or /BL.

Memory device 100 may be generally configured to receive various inputs (e.g., from an external controller) via various terminals, such as address and command terminals 108, clock terminals 110, and data terminals 122. Memory device 100 may include additional terminals such as a power supply terminal 124 and a power supply terminal 126, which may be coupled to a voltage generator 120.

During a contemplated operation, one or more command signals COM, received via address and command terminals 108, may be conveyed to a command decoder 116 via a command/address input circuit 112. Command decoder 116 may include a circuit configured to generate various internal commands via decoding the one or more command signals COM. Examples of the internal commands include an active command ACT and a read/write signal RAY.

Further, one or more address signals ADD, received via address and command terminals 108, may be conveyed to an address decoder 114 via command/address input circuit 112. Address decoder 114 may be configured to supply a row address XADD to row decoder 104 and a column address YADD to column decoder 106. Although command/address input circuit 112 is illustrated as a single circuit, in some embodiments, command/address input circuit 112 may comprise more than one circuit.

Active command ACT may include a pulse signal that is activated in response to a command signal COM indicating row access (e.g., an active command). In response to active signal ACT, row decoder 104 of a specified bank address may be activated. As a result, the word line WL specified by row address XADD may be selected and activated.

Read/write signal RAY may include a pulse signal that is activated in response to a command signal COM indicating column access (e.g., a read command or a write command). In response to the read/write signal R/W, column decoder 106 may be activated, and the bit line BL specified by the column address YADD may be selected.

In response to active command ACT, a read signal, a row address XADD, and a column address YADD, data may be read from the memory cell MC specified by the row address XADD and the column address YADD. The read data may be output via sense amplifier SAMP, transfer gate TG, read/write amplifiers 160, an input/output circuit 162, and data terminals 122. Further, in response to active command ACT, a write signal, a row address XADD, and a column address YADD, write data may be supplied to memory cell array 102 via data terminals 122, input/output circuit 162, read/write amplifiers 160, transfer gate TG, and sense amplifier SAMP. The write data may be written to the memory cell MC specified by the row address XADD and the column address YADD.

In addition, memory device 100 may include fuses/registers 164, which may include one or more fuse circuits and/or one or more registers (e.g., test mode fuse, mode register (MR), without limitation). For example, one or more settings of a mode register (e.g., of fuses/registers 164) may be used to define one or more operations to be performed in response to detection of a glitch. Further, according to some embodiments, one or more threshold values (e.g., for defining a timing aperture) may be set (e.g., by a user) via one or more fuses (e.g., a test mode fuse) of fuses/registers 164. As will be appreciated, fuses/registers 164 may be coupled to one or more other components of memory device 100, such as, but not limited to, column decoder 106, row decoder 104, memory cell array 102, read/write amplifiers 160, input/output circuit 162, circuitry 166, and possibly other components.

Clock signals CK and /CK may be received via clock terminals 110. A clock input circuit 118 may generate internal clock signals ICK based on the clock signals CK and /CK. Internal clock signals ICK may be conveyed to various components of memory device 100, such as input/output circuit 162 (e.g., for controlling the operation timing of input/output circuit 162).

Memory device 100 may further include circuitry 166 configured to carry out various embodiments of the present disclosure. For example, circuitry 166 may include one or more pulse detectors, filters (also referred to herein as "detection apertures"), and/or logic, as will be described more fully below with reference to at least FIGS. 2 and 4-9. As will be appreciated, circuitry 166 may be coupled to one or more other components of memory device 100, such as, but not limited to, command/address input circuit 112, address decoder 114, command decoder 116, column decoder 106, row decoder 104, memory cell array 102, read/write amplifiers 160, input/output circuit 162, fuses/registers 164, clock input circuit 118, and possibly other components. In some embodiments, at least a portion of circuitry 166 may be included within at least one other component of memory device 100 (e.g., within input/output circuit 162).

Figure 2:
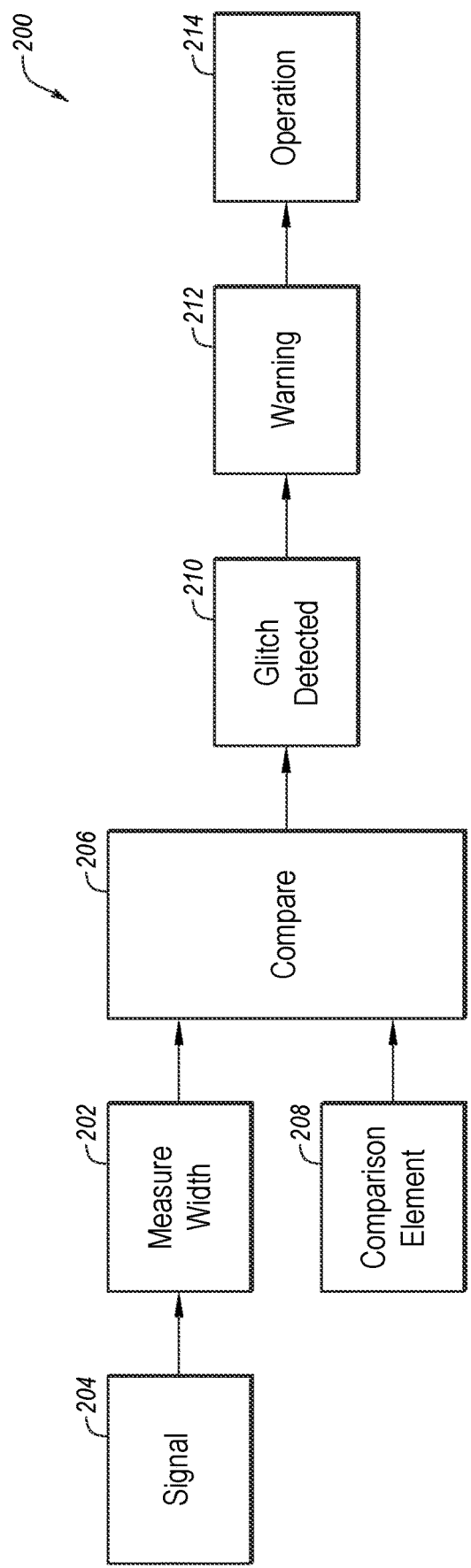
FIG. 2 is a diagram of an example flow that may be used to detect a glitch, according to various embodiments of the present disclosure.
Figure 3A:
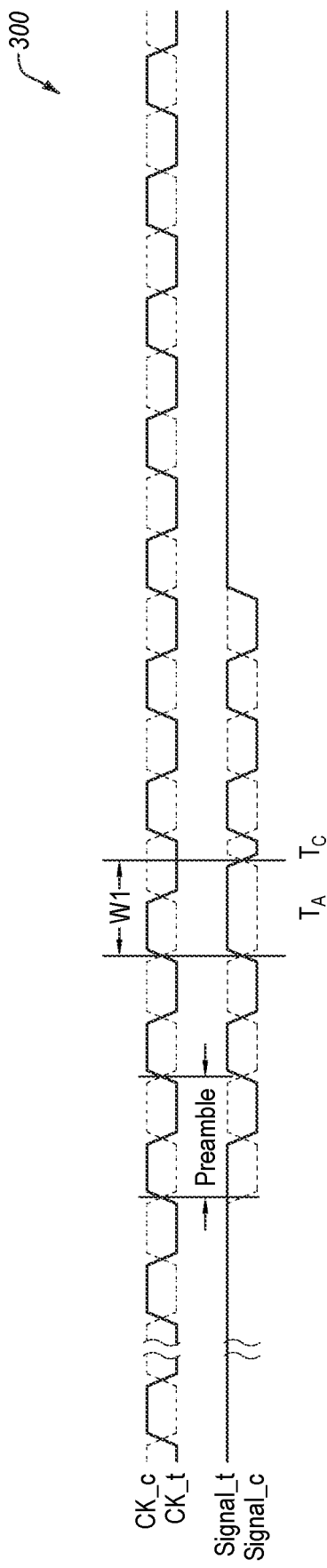
FIGS. 3A and 3B depict example timing diagrams that correspond to a contemplated operation of a semiconductor device, in accordance with one or more embodiments of the present disclosure.
Figure 3B:
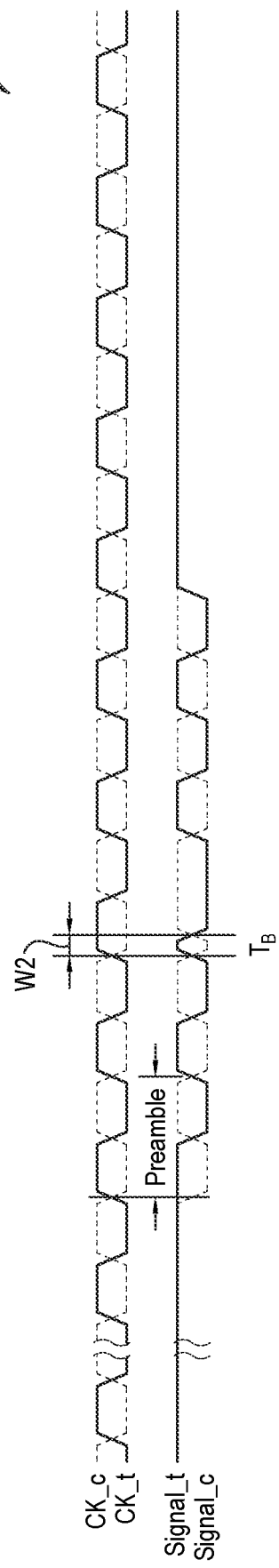

FIG. 2 is a diagram of an example flow 200 that may be used to detect a glitch, according to various embodiments of the present disclosure. In some embodiments, at least a portion of flow 200 may be an example of a contemplated operation of a semiconductor device. FIGS. 3A and 3B depict example timing diagrams 300 and 350, respectively, which correspond to a contemplated operation of a semiconductor device, in accordance with one or more embodiments of the present disclosure.

With reference to FIGS. 2, 3A, and 3B, flow 200 may begin at block 202, wherein a width of a pulse of a received signal (e.g., a command, a data signal, a data strobe signal (DQS), without limitation) 204 is detected and/or measured. For example, signal 204 may be a DQS signal, such as a signal including a true component "signal_t" and a complement component "signal_c," as illustrated in FIGS. 3A and 3B. Further, at block 206, the width of the pulse of signal 204 may be compared to a comparison element 208. As described more fully herein, comparison element 208 may include, for example, a control signal and/or a timing signal (e.g., a pulse and/or a clock signal). In some embodiments, comparison element 208 may define and/or may be used to define a timing aperture (also referred to herein as "timing window") (e.g., with an upper pulse width threshold and/or a lower pulse width threshold), which may be used to determine whether a width of a pulse (e.g., of signal 204) is acceptable (e.g., a non-glitch pulse) or unacceptable (e.g., a glitch).

In at least one example, comparison element 208 may be or define the timing aperture, such as at least a portion (e.g., a clock cycle) of a clock signal having a true component "CK_t" and a complement component "CK_c," as illustrated in FIGS. 3A and 3B. As a more specific example, comparison element 208 may be or define a timing aperture between one-fourth of a clock cycle of a clock signal (e.g., 0.25CK) and three-fourths of a clock cycle of the clock signal (e.g., 0.75CK). In this example, the width of the pulse of signal 204 may be compared to upper and lower limits of the timing aperture. More specifically, for example, if the timing aperture is 0.25CK-0.75CK, the width of signal 204 may be compared to the lower limit (i.e., 0.25CK) and the upper limit (i.e., 0.75CK) of the timing aperture (e.g., at block 206). If the width of the pulse of signal 204 is either less than the lower limit (i.e., 0.25CK in this example) or greater than the upper limit (i.e., 0.75CK in this example), a glitch may be detected, as depicted at block 210. As one example, as shown in FIG. 3A, at a time TA, a width W1 of a pulse of signal_t is greater than 0.75CK, and therefore, a glitch may be detected. As another example, as shown in FIG. 3B, at a time TB, a width W2 of a pulse of signal_t is less than 0.25CK, and therefore, a glitch may be detected.

If the width of the pulse of signal 204 is neither less than the lower limit (i.e., 0.25CK in this example) nor greater than the upper limit (i.e., 0.75CK in this example), a glitch may not be detected. For example, if a glitch is not detected, flow 200 may return to block 202 (i.e., from block 206), where a width of another pulse of a signal (e.g., signal 204 or another signal) may be measured.

According to at least some embodiments, in response to a glitch being detected (e.g., at block 210), a glitch indicator (also referred to herein as a "warning indicator" or a "warning") may be generated (e.g., asserted) at block 212, and flow 200 may proceed to block 214. For example, an indication (e.g., a warning) of the glitch may be provided via an alert signal (ALERT_n) and/or via an alert pin, or another available pin, of a semiconductor device.

Further, according to some embodiments, at block 214, one or more operations may be performed in response to detection of the glitch. For example, in response to detection of the glitch (e.g., of a DQS signal), one or more input/output operations (e.g., enabling and/or disabling operations) may be performed and/or modified based on one or more mode register settings, as described above.

Figure 4:
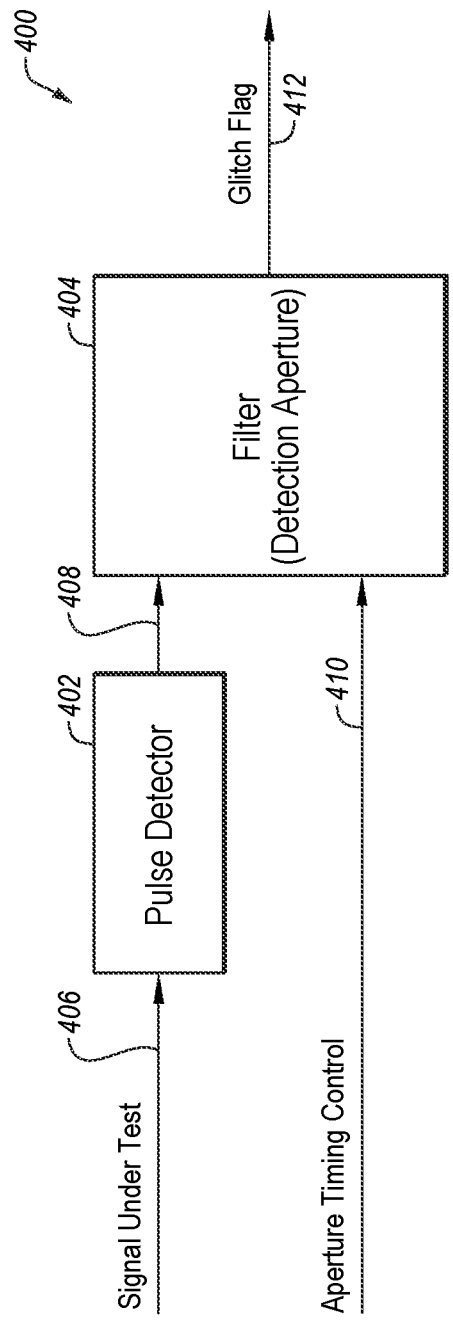
FIG. 4 is a block diagram depicting a portion of an example device including a pulse detector and a filter, in accordance with various embodiments of the present disclosure.

FIG. 4 is a block diagram depicting a portion of an example device 400, in accordance with various embodiments of the present disclosure. Device 400, which may include or may be part of a semiconductor device (e.g., within circuitry 166 of memory device 100 of FIG. 1), includes a pulse detector 402 and a filter 404. For example, pulse detector 402 and other pulse detectors described herein may also be referred to herein as a "pulse detection module," a "pulse detector block," or some variation thereof. Filter 404 and other filters described herein may also be referred to herein as a "timing filter," a "detection aperture," a "glitch detector," a "glitch detection module," some variation thereof, or simply "circuitry."

According to various embodiments, pulse detector 402 may be configured to receive a signal (e.g., a "signal under test") 406, which may include any signal of device 400. For example, only, signal 406 may include any timing-critical signal that may be sensitive to glitches and/or truncated pulses. As a more specific example, signal 406 may include a DQS signal, an address signal (e.g., a decoded address signal), a command signal (e.g., a decoded command), a clock signal, a read latency calculation signal, another timing-critical signal, or another suitable signal. Pulse detector 402 may be configured to receive signal 406, detect and convey a pulse 408 (i.e., of signal 406) to filter 404. For example, pulse detector 402 may detect both rising and falling edges of a pulse of signal 406. Pulse detection is understood by a person having ordinary skill in the art, and pulse detector 402 may detect pulses via any known and suitable manner (e.g., differential pairs, direct edge detection, etc.).

Filter 404 may comprise any suitable circuitry (e.g., logic circuitry (e.g., logic gates) or other circuitry, such as comparators, latches, flip-flops, sense amplifiers, without limitation). Filter 404 may be configured to receive pulse 408 and an aperture timing control signal 410, which may indicate and/or define a timing aperture and/or may be used to define a timing aperture (i.e., for filter 404). For example, aperture timing control signal 410 may comprise one or more signals (e.g., one or more control signals and/or a timing signal (e.g., a clock signal and/or a pulse)) indicative of a size of a desired timing aperture (i.e., an acceptable range of pulse widths).

According to some embodiments, aperture timing control signal 410 may be determined based on a signal of interest. For example, command decode signals may operate on full-period clocks, and thus command decode signals may last for a full clock period. In this case, the timing aperture may be set (e.g., via aperture timing control signal 410) to suitable ranges, either using a system clock or delay generators. For a latency calculation signal, critical glitch-sensitive timing is usually near a start/end of the calculated latency, and thus in this example the timing aperture may be associated with a start/end of the calculated timing, using the signals that determine the latency as aperture timing control signal 410 (i.e., to enable and disable the glitch detection near the start and end of the calculation).

In one example wherein aperture timing control signal 410 or another signal includes one or more control signals, in response to receipt of the one or more control signals, filter 404 may set one or more thresholds that may be used to distinguish an acceptable pulse from a problematic glitch. For example, in response to aperture timing control signal 410, filter 404 may set a lower pulse width threshold (a "lower limit") as, for example, a percentage of a clock cycle and/or time duration (e.g., in nanoseconds or picoseconds). Additionally, or alternatively, in response to aperture timing control signal 410, filter 404 may set an upper pulse width threshold (an "upper limit") as, for example, a percentage of a clock cycle and/or time duration (e.g., in nanoseconds or picoseconds).

Further, in some embodiments, aperture timing control signal 410 may include a timing signal (e.g., a pulse and/or a clock signal (e.g., a system clock signal or a derivative of a system clock signal))). In these embodiments, a pulse (e.g., signal 406) may be compared against the timing signal to determine whether or not the pulse is a glitch. For example, with reference to FIG. 3B, at time TB, signal_t (i.e., the true portion of the signal of interest) rises and falls during a "high time" of clock signal CK_t (i.e., the true portion of the timing signal), and thus it may be determined that the pulse of signal_t is a glitch. Further, with reference to FIG. 3A, at around time Tc, signal_t falls and rises during a "low time" of clock signal CK_t, and thus it may be determined that the pulse of signal_t is a glitch.

As will be described more fully below, true and complement components of a test signal (e.g., signal_t and signal_c) may be compared to true and complement components of a timing signal (e.g., clock signal CK_t and clock signal CK_c) to detect glitches in a number of pulses of the test signal. Further, as will be appreciated, in embodiments wherein control signal 410 is a clock signal, a timing aperture may scale with a frequency of the clock signal. For example, as the clock frequency decreases, the timing aperture (i.e., the acceptable range of pulse widths) may automatically scale (e.g., increase) with the clock frequency.

With reference again to FIG. 4, filter 404 may be configured to compare pulse 408 to one or more defined thresholds and/or aperture timing control signal 410. For example, in at least one embodiment, filter 404 may compare a width of pulse 408 to one or more defined thresholds (e.g., via one or more logic circuits). In response to the comparison of the width of pulse 408 to the one or more defined thresholds, filter 404 may generate a signal 412 that may be indicative of whether pulse 408 is either an acceptable pulse or a glitch. In one specific example, if the width of pulse 408 is either greater than an upper threshold width or less than a lower threshold width, signal 412 may be asserted to indicate that pulse 408 is a glitch. Alternatively, if the width of pulse 408 is neither greater than the upper threshold width nor less than the lower threshold width, signal 412 may be negated to indicate that pulse 408 is an acceptable pulse.

In other embodiments wherein aperture timing control signal 410 includes a timing signal (e.g., a pulse and/or a clock signal), filter 404 may compare the timing signal to a width of pulse 408. In response to the comparison of the width of pulse 408 to the timing signal, filter 404 may generate signal 412 that may be indicative of whether pulse 408 is either an acceptable pulse or a glitch. In one example, if two edges (i.e., falling and rising or rising and falling) of pulse 408 occur during a "high time" or "low time" of the timing signal, a glitch may be detected. In another example, if the width of pulse 408 is either greater than an upper pulse width threshold (e.g., 0.75CK) or less than a lower pulse width threshold (e.g., 0.25CK), signal 412 may be asserted to indicate that pulse 408 is a glitch. Alternatively, if the width of pulse 408 is neither greater than the upper pulse width threshold nor less than the lower pulse width threshold (e.g., 0.25CK<=the width of pulse 408<=0.75CK), signal 412 may be negated to indicate that pulse 408 is an acceptable pulse.

Figure 5:
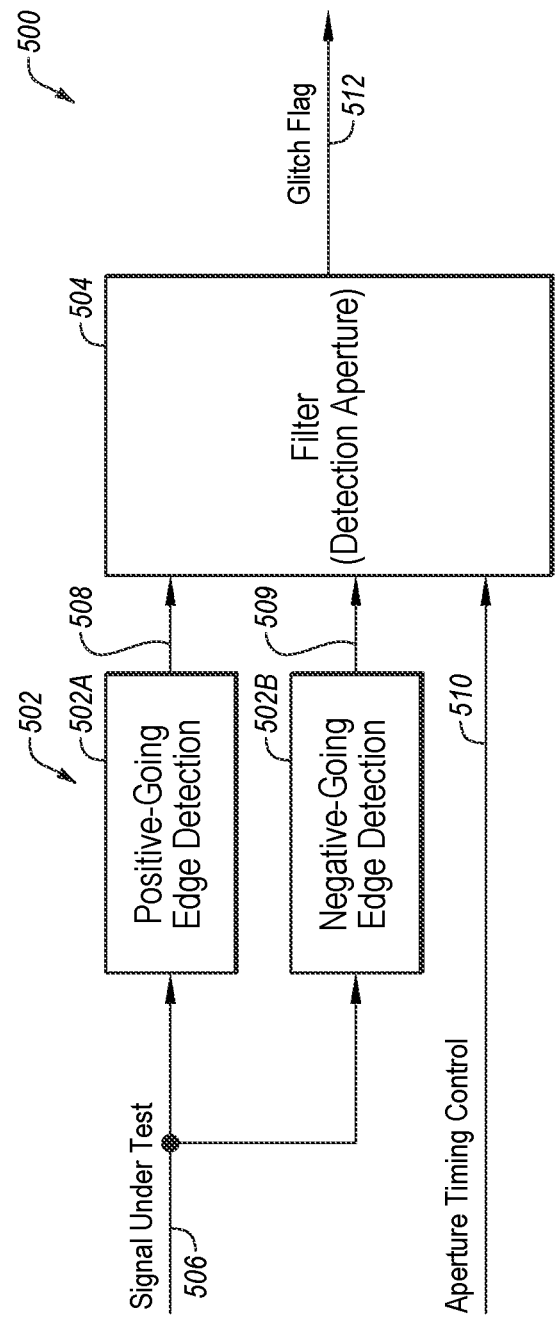
FIG. 5 is a block diagram depicting a portion of another example device including positive and negative pulse detectors and a filter, in accordance with various embodiments of the present disclosure.

According to some embodiments, a pulse detector may include multiple polarities, which may increase the likelihood of detecting high-going and low-going glitches. For example, FIG. 5 is a block diagram depicting a portion of another example device 500, in accordance with various embodiments of the present disclosure. Device 500 is similar to device 400 of FIG. 4; however, in the embodiment of FIG. 5, a pulse detector 502 includes a positive edge detector 502A for detecting positive edges and a negative edge detector 502B for detecting negative edges. Device 500 further includes a filter 504, which may include filter 404 of FIG. 4. By detecting each edge of a signal under test (i.e., individually), control of filter 504 may be enhanced (e.g., in comparison to the embodiment of FIG. 4).

According to various embodiments, each of positive edge detector 502A and negative edge detector 502B are configured to receive a signal (e.g., a "signal under test") 506, which may include any signal of device 500. Like signal 406 of FIG. 4, signal 506 may include, for example, any timing-critical signal that may be sensitive to glitches and/or truncated pulses. Positive edge detector 502A may be configured to receive signal 506, detect and capture a rising edge of signal 506, and convey a captured signal (i.e., a result of the detection) (e.g., a logical signal (HIGH or LOW) including timing information) 508 to filter 504. Negative edge detector 502B may be configured to receive signal 506, detect a falling edge of signal 506, and convey a captured signal (i.e., a result of the detection) (e.g., a logical signal (LOW or HIGH) including timing information) 509 to filter 504. Pulse detection via rising and falling edges is understood by a person having ordinary skill in the art, and pulse detector 502 may detect the rising and falling edges of signal 506 via any known and suitable manner.

Filter 504 may be configured to receive an aperture timing control signal 510, which may indicate and/or define a timing aperture and/or may be used to define a timing aperture. In embodiments wherein aperture timing control signal 510 includes a timing signal (e.g., a pulse and/or a clock signal), filter 504 may compare the timing signal to captured signals 508 and 509. In response to the comparison of captured signals 508 and 509 to the timing signal, filter 504 may generate signal 512 that may be indicative of whether or not a glitch was detected.

In some examples, captured signal 508 may be compared against a "high time" of a first half of a clock cycle of a clock signal (i.e., of the timing signal), and captured signal 509 may be compared against a "low time" of a second half of the clock cycle of the clock signal (i.e., of the timing signal). In this example, if captured signal 508 rises and falls during the "high time" of the first half of the clock cycle of the clock signal, a glitch may be detected. Further, if captured signal 509 falls and rises during the "low time" of the second half of the clock cycle of the clock signal, a glitch may be detected.

In another example wherein aperture timing control signal 510 includes a pulse, a first (e.g., rising) edge of the pulse may be the start of the timing aperture and the second (e.g., falling) edge may be the end of the timing aperture. In this example, if a captured signal (e.g., captured signal 508) rises and falls during the timing aperture, a glitch may be detected.

As yet another example, if the width of either captured signal 508 or captured signal 509 is either greater than an upper pulse width threshold (e.g., 0.75CK) or less than a lower pulse width threshold (e.g., 0.25CK), signal 512 may be asserted to indicate a glitch. Alternatively, if the width of captured signal 508 is neither greater than the upper pulse width threshold nor less than the lower pulse width threshold (e.g., 0.25CK<=the width of pulse 508<=0.75CK), and the width of captured signal 509 is neither greater than the upper pulse width threshold nor less than the lower pulse width threshold (e.g., 0.25CK<=the width of pulse 509<=0.75CK), signal 512 may be negated to indicate that signal 506 does not include a glitch.

Figure 6:
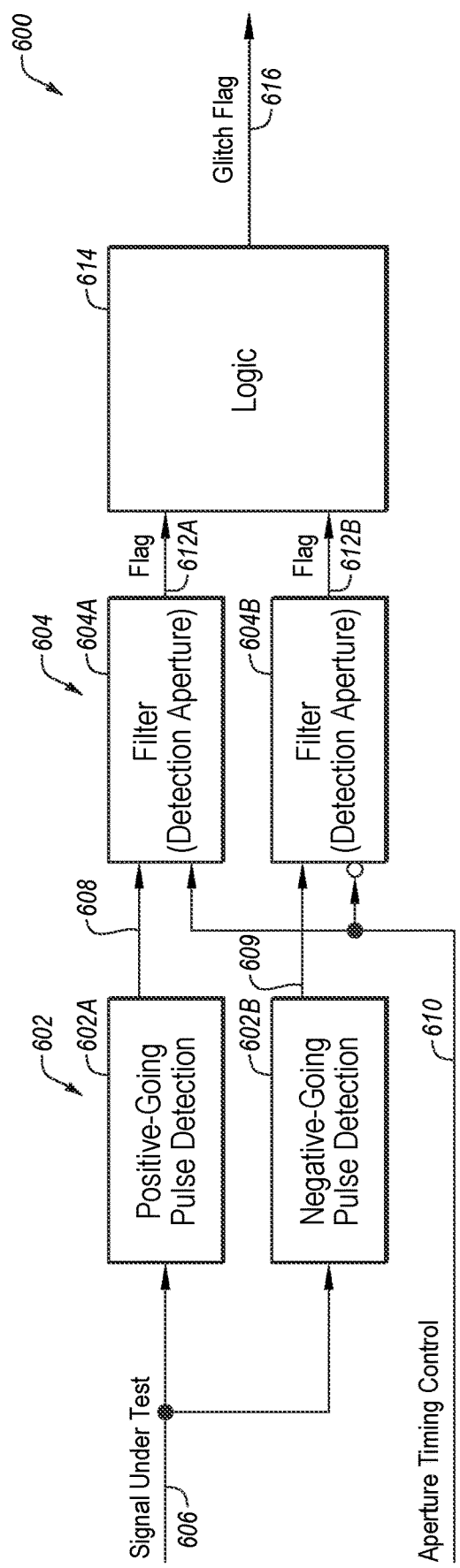
FIG. 6 is a block diagram depicting a portion of another example device including positive and negative pulse detectors, two filters, and logic, in accordance with various embodiments of the present disclosure.

Further, according to some embodiments, a filter (i.e., a detection aperture) may include more than one filter component (i.e., more than one detection aperture). For example, FIG. 6 is a block diagram depicting a portion of another example device 600, in accordance with various embodiments of the present disclosure. Device 600 is similar to device 500 of FIG. 5; however, in the embodiment of FIG. 6, a filter 604 includes a filter 604A and a filter 604B. Each of filter 604A and filter 604B may comprise any suitable circuitry (e.g., logic circuitry (e.g., logic gates) or other circuitry, such as comparators, latches, flip-flops, sense amplifiers, without limitation). Device 600 further includes logic 614. For example, only, logic 614 may include an OR gate and/or one or more other logic circuits. Like device 500, device 600 further includes a pulse detector 602 including a positive edge detector 602A and a negative edge detector 602B.

According to various embodiments, each of positive edge detector 602A and negative edge detector 602B are configured to receive a signal (e.g., a "signal under test") 606, which may include any signal of device 600. Like signal 406 of FIG. 4, signal 606 may include, for example, any timing-critical signal that may be sensitive to glitches and/or truncated pulses. Positive edge detector 602A may be configured to receive signal 606, detect and capture a rising edge of signal 606, and convey a captured signal (i.e., a result of the detection) (e.g., a logical signal (HIGH or LOW) including timing information) 608 to filter 604A. Negative edge detector 602B may be configured to receive signal 606, detect a falling edge of signal 606, and convey a captured signal (i.e., a result of the detection) (e.g., a logical signal (LOW or HIGH) including timing information) 609 to filter 604B.

Each of filter 604A and 604B may be configured to receive an aperture timing control signal 610, which may indicate and/or define a timing aperture and/or may be used to define a timing aperture (i.e., for each of filter 604A and 604B). It is noted that an input of filter 604B that is configured to receive aperture timing control signal 610 includes an inversion bubble such that filter 604B is configured to compare captured signal 609 to a LOW timing signal, whereas filter 604A is configured to compare captured signal 608 to a HIGH timing signal.

In embodiments wherein aperture timing control signal 610 includes a timing signal (e.g., a pulse and/or a clock signal), filter 604A may compare at least a portion of the timing signal to captured signal 608, and filter 604B may compare at least a portion of the timing signal to captured signal 609.

In response to a comparison of captured signal 608 to the timing signal, filter 604A may generate signal 612A that may be indicative of whether captured signal 608 is either an acceptable pulse or a glitch. Further, in response to a comparison of captured signal 609 to the timing signal, filter 604B may generate signal 612B that may be indicative of whether captured signal 609 is either an acceptable pulse or a glitch.

In at least one example, filter 604A may compare captured signal 608 against a "high time" of a first half of a clock cycle of a clock signal (i.e., of the timing signal), and filter 604B may compare captured signal 609 against a "low time" of a second half of the clock cycle of the clock signal (i.e., of the timing signal). In this example, if captured signal 608 rises and falls during the "high time" of the first half of the clock cycle of the clock signal, filter 604A may assert signal 612A (e.g., to indicate that captured signal 608 includes a glitch). Further, if captured signal 609 falls and rises during the "low time" of the second half of the clock cycle of the clock signal, filter 604B may assert signal 612B (e.g., to indicate that captured signal 609 includes a glitch).

As another example, if the width of captured signal 608 is either greater than an upper pulse width threshold (e.g., 0.75CK) or less than a lower pulse width threshold (e.g., 0.25CK), signal 612A may be asserted. Similarly, if the width of captured signal 609 is either greater than an upper pulse width threshold (e.g., 0.75CK) or less than a lower pulse width threshold (e.g., 0.25CK), signal 612B may be asserted. Alternatively, if the width of captured signal 608 is neither greater than the upper pulse width threshold nor less than the lower pulse width threshold (e.g., 0.25CK<=the width of pulse 608<=0.75CK), and the width of captured signal 609 is neither greater than the upper pulse width threshold nor less than the lower pulse width threshold (e.g., 0.25CK<=the width of pulse 608<=0.75CK), each of signal 612A and signal 612B may be negated (e.g., to indicate that captured signals 608 and 609 are acceptable).

Logic 614 may be configured to receive signal 612A and signal 612B and generate a signal 616. According to some embodiments, signal 616 may be asserted (e.g., a HIGH signal) in response to either signal 612A or signal 612B being asserted (e.g., HIGH). Further, signal 616 may be negated (e.g., a LOW signal) in response to both signal 612A and signal 612B being negated (e.g., LOW).

Figure 7:
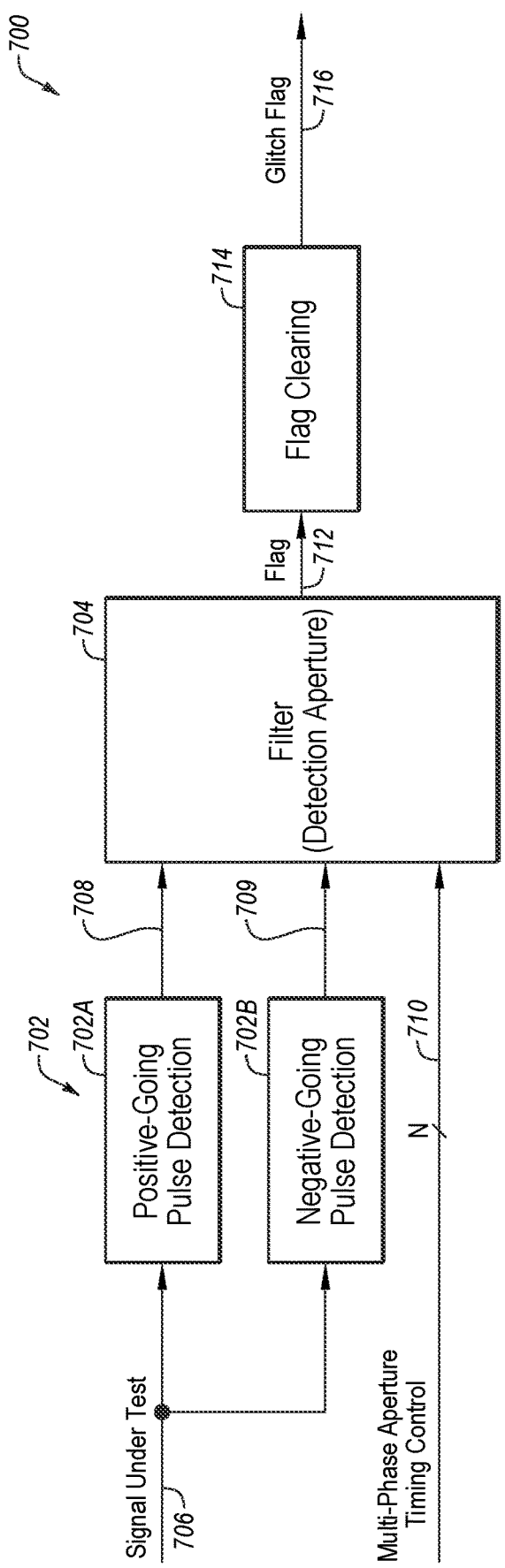
FIG. 7 is a block diagram depicting a portion of another example device including positive and negative pulse detectors, a filter, and logic, in accordance with various embodiments of the present disclosure.

In other embodiments, multi-phase aperture timing control may be used wherein a filter may compare a positive-going pulse with a positive-going signal (e.g., a clock signal) during a one phase and compare a negative-going pulse with a negative-going signal (e.g., a clock signal) during another phase. For example, FIG. 7 is a block diagram depicting a portion of another example device 700 including multi-phase aperture timing control, in accordance with various embodiments of the present disclosure. Similar to device 600 of FIG. 6, device 700 includes a pulse detector 702 including a positive edge detector 702A and a negative edge detector 702B. Further, device 700 includes a filter 704, which may comprise any suitable circuitry (e.g., logic circuitry (e.g., logic gates) or other circuitry, such as comparators, latches, flip-flops, sense amplifiers, without limitation). In some embodiments, device 700 may include a reset block 714, which may be configured to clear a glitch flag (e.g., periodically and/or after a burst of data is read and/or written).

According to various embodiments, each of positive edge detector 702A and negative edge detector 702B are configured to receive a signal (e.g., a "signal under test") 706, which may include any signal of device 700. Like signals 406, 506, and 606 described above, signal 706 may include, for example, any timing-critical signal that may be sensitive to glitches and/or truncated pulses. Positive edge detector 702A may be configured to receive signal 706, detect and capture a rising edge of signal 706, and convey a captured signal (i.e., a result of the detection) (e.g., a logical signal (HIGH or LOW) including timing information) 708 to filter 704. Negative edge detector 702B may be configured to receive signal 706, detect a falling edge of signal 706, and convey a captured signal (i.e., a result of the detection) (e.g., a logical signal (LOW or HIGH) including timing information) 709 to filter 704.

Filter 704 may be configured to receive an N-bit aperture timing control signal 710, which may indicate and/or define a timing aperture and/or may be used to define a timing aperture (i.e., for each phase of a number of phases). In embodiments wherein N-bit aperture timing control signal 710 includes a timing signal (e.g., a pulse and/or a clock signal), during one phase (e.g., a first phase), filter 704 may be configured to compare the timing signal to captured signal 708 (i.e., for a first timing aperture). Moreover, during another phase (e.g., a second phase), filter 704 may be configured to compare the timing signal to captured signal 709 (i.e., for a second timing aperture). In response to the comparison of captured signal 708 and captured signal 709 to the timing, filter 704 may convey a signal 712 that may be indicative of whether both captured signals 708 and 709 are acceptable pulses or whether captured signal 708 and/or captured signal 709 is a glitch.

In some examples, captured signal 708 may be compared against a "high time" of a first half of a clock cycle of a clock signal (i.e., of the timing signal), and captured signal 709 may be compared against a "low time" of a second half of the clock cycle of the clock signal (i.e., of the timing signal). In this example, if captured signal 708 rises and falls during the "high time" of the first half of the clock cycle of the clock signal, a glitch may be detected. Further, if captured signal 709 falls and rises during the "low time" of the second half of the clock cycle of the clock signal, a glitch may be detected.

In another example wherein N-bit aperture timing control signal 710 includes a pulse, a first (e.g., rising) edge of the pulse may be the start of the timing aperture and the second (e.g., falling) edge may be the end of the timing aperture. In this example, if a captured signal (e.g., captured signal 708) rises and falls during the timing aperture, a glitch may be detected.

As yet another example, if the width of either captured signal 708 or captured signal 709 is either greater than an upper pulse width threshold (e.g., 0.75CK) or less than a lower pulse width threshold (e.g., 0.25CK), signal 712 may be asserted to indicate a glitch. Alternatively, if the width of captured signal 708 is neither greater than the upper pulse width threshold nor less than the lower pulse width threshold (e.g., 0.25CK<=the width of pulse 708<=0.75CK), and the width of captured signal 709 is neither greater than the upper pulse width threshold nor less than the lower pulse width threshold (e.g., 0.25CK<=the width of pulse 709<=0.75CK), signal 712 may be negated to indicate that signal 706 does not include a glitch.

According to various embodiments, signal 712 may be received at reset block 714, wherein a glitch flag 716 may be reset (e.g., periodically, in response to an event (e.g., timing event), and/or after burst of data is read and/or written).

Figure 8:
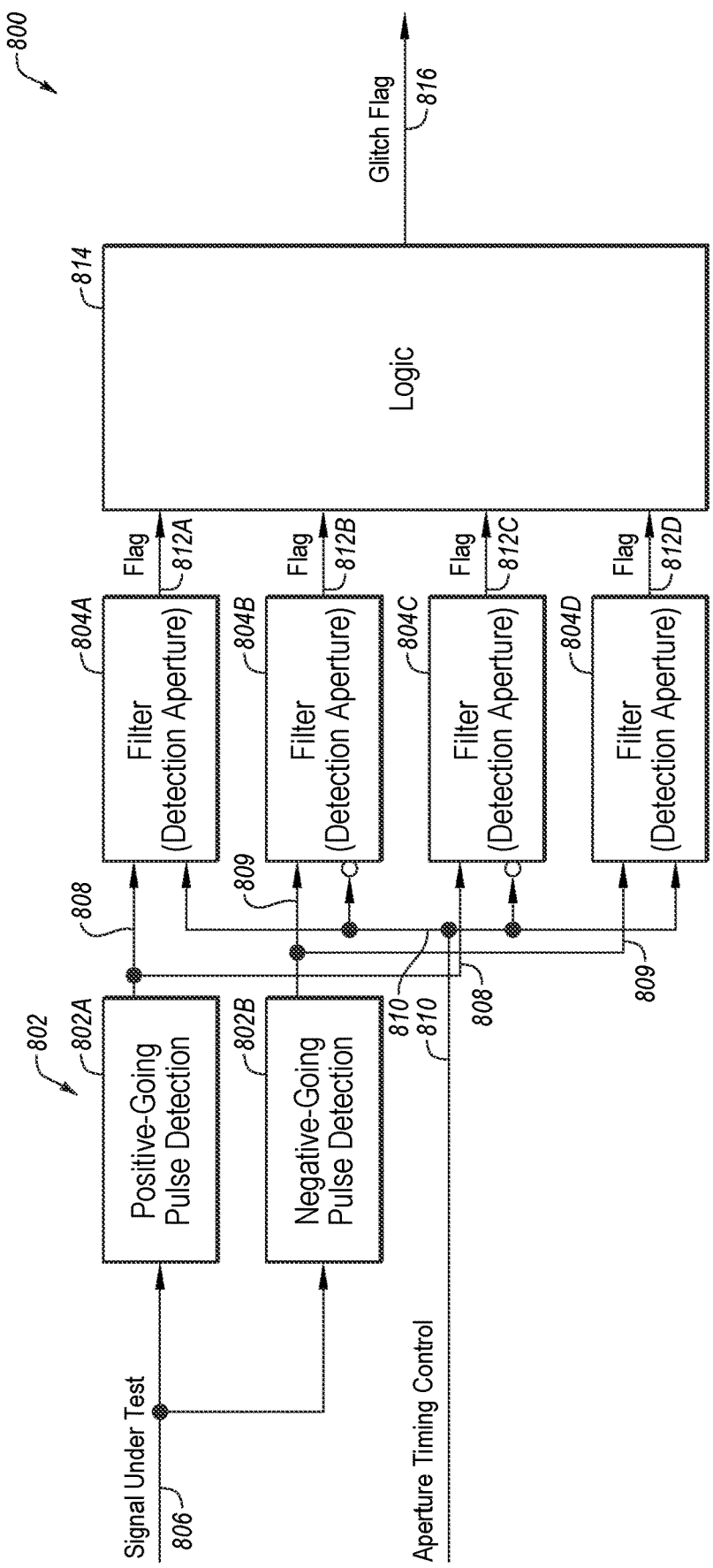
FIG. 8 is a block diagram depicting a portion of yet another example device including positive and negative pulse detectors, a number of filters, and logic, in accordance with various embodiments of the present disclosure.

FIG. 8 is a block diagram depicting a portion of another example device 800, in accordance with various embodiments of the present disclosure. In the embodiment of FIG. 8, rising and falling edges of a signal 806 may be analyzed (e.g., compared to true and complement signal of a clock signal) to detect a glitch.

Device 800 includes a pulse detector 802 including a positive edge detector 802A and a negative edge detector 802B. Device 800 further includes a first filter 804A, a second filter 804B, a third filter 804C, and a fourth filter 804D. Each of filter 804A-804D may comprise any suitable circuitry (e.g., logic circuitry (e.g., logic gates) or other circuitry, such as comparators, latches, flip-flops, sense amplifiers, without limitation). Device 800 further includes logic 814. For example, only, logic 814 may include an OR gate and/or one or more other logic circuits.

According to various embodiments, each of positive edge detector 802A and negative edge detector 802B are configured to receive a signal (e.g., a "signal under test") 806, which may include any signal of device 800. Like signals 406, 506, 606, and 706, signal 806 may include, for example, any timing-critical signal that may be sensitive to glitches and/or truncated pulses. Positive edge detector 802A may be configured to receive signal 806, detect and capture a rising edge of signal 806, and convey a captured signal (i.e., a result of the detection) (e.g., a logical signal (HIGH or LOW) including timing information) 808 to filters 804A and 804C. Negative edge detector 802B may be configured to receive signal 806, detect a falling edge of signal 806, and convey a captured signal (i.e., a result of the detection) (e.g., a logical signal (LOW or HIGH) including timing information) 809 to filters 804B and 804D.

Each of filter 804A, 804B, 804C, and 804D may be configured to receive an aperture timing control signal 810, which may indicate and/or define a timing aperture and/or may be used to define a timing aperture (i.e., for each of filter 804A, 804B, 804C, and 804D). It is noted that an input of filters 804B and 804C that are configured to receive aperture timing control signal 810 includes an inversion bubble such that filters 804B and 804C are configured to compare a captured signal to a LOW timing signal, whereas filters 804A and 804D are configured to compare a captured signal to a HIGH timing signal.

In embodiments wherein aperture timing control signal 810 includes a timing signal (e.g., a pulse and/or a clock signal), filter 804A may compare at least a portion of the timing signal to captured signal 808, filter 804B may compare at least a portion of the timing signal to captured signal 809, filter 804C may compare at least a portion of the timing signal to captured signal 808, and filter 804D may compare at least a portion of the timing signal to captured signal 809.

Filter 804A may compare a rising edge of a true portion of the timing signal to captured signal 808. In response to the comparison of captured signal 808 to the timing signal, filter 804A may generate signal 812A that may be indicative of whether or not a glitch was detected. More specifically, in at least one example, filter 804A may compare captured signal 808 against a "high time" of a first half of a clock cycle of a true portion of a clock signal (i.e., of the timing signal). In this example, if captured signal 808 rises and falls during the "high time" of the first half of the clock cycle of a true portion of the clock signal, filter 804A may assert signal 812A.

Further, filter 804B may compare a falling edge of a true portion of the timing signal to captured signal 809. In response to the comparison of captured signal 809 to the timing signal, filter 804B may generate signal 812B that may be indicative of whether or not a glitch was detected. More specifically, in at least one example, filter 804B may compare captured signal 809 against a "low time" of a second half of the clock cycle of the true portion of the clock signal (i.e., of the timing signal). In this example, if captured signal 809 falls and rises during the "low time" of the second half of the clock cycle of the true portion of clock signal, filter 804B may assert signal 812B.

Further, filter 804C may compare a rising edge of a complement portion of the timing signal to captured signal 808. In response to the comparison of captured signal 808 to the timing signal, filter 804C may generate signal 812C that may be indicative of whether or not a glitch was detected. More specifically, in at least one example, filter 804C may compare captured signal 808 against a "high time" of a second half of a clock cycle of a complement portion of the clock signal (i.e., of the timing signal). In this example, if captured signal 808 rises and falls during the "high time" of the second half of the clock cycle of the complement portion of the clock signal, filter 804C may assert signal 812C.

Additionally, filter 804D may compare a falling edge of the complement portion of the timing signal to captured signal 809. In response to the comparison of captured signal 809 to the timing signal, filter 804D may generate signal 812D that may be indicative of whether or not a glitch was detected. More specifically, in at least one example, filter 804D may compare captured signal 809 against a "low time" of a first half of the clock cycle of the complement portion of the clock signal (i.e., of the timing signal). In this example, if captured signal 809 falls and rises during the "low time" of the first half of the clock cycle of the complement portion of the clock signal, filter 804D may assert signal 812D.

Logic 814 may be configured to receive signals 812A-812D and generate a signal 816. According to some embodiments, signal 816 may be asserted (e.g., HIGH) in response to at least one of signals 812A-812D being asserted (e.g., HIGH). Further, signal 816 may be negated (e.g., LOW) in response to each of signals 812A-812D being negated (e.g., LOW).

Is it noted that a difference between signal 808 captured at 804A and signal 808 captured at 804C is the timing of the aperture. In other words, the same height/width of a glitch may be captured, with the difference being the timing of the aperture (i.e., result from filter 804A versus filter 804C). Knowing the location in time of the glitch may be beneficial and may be decoded (e.g., on logic 814) as needed.

Figure 9:
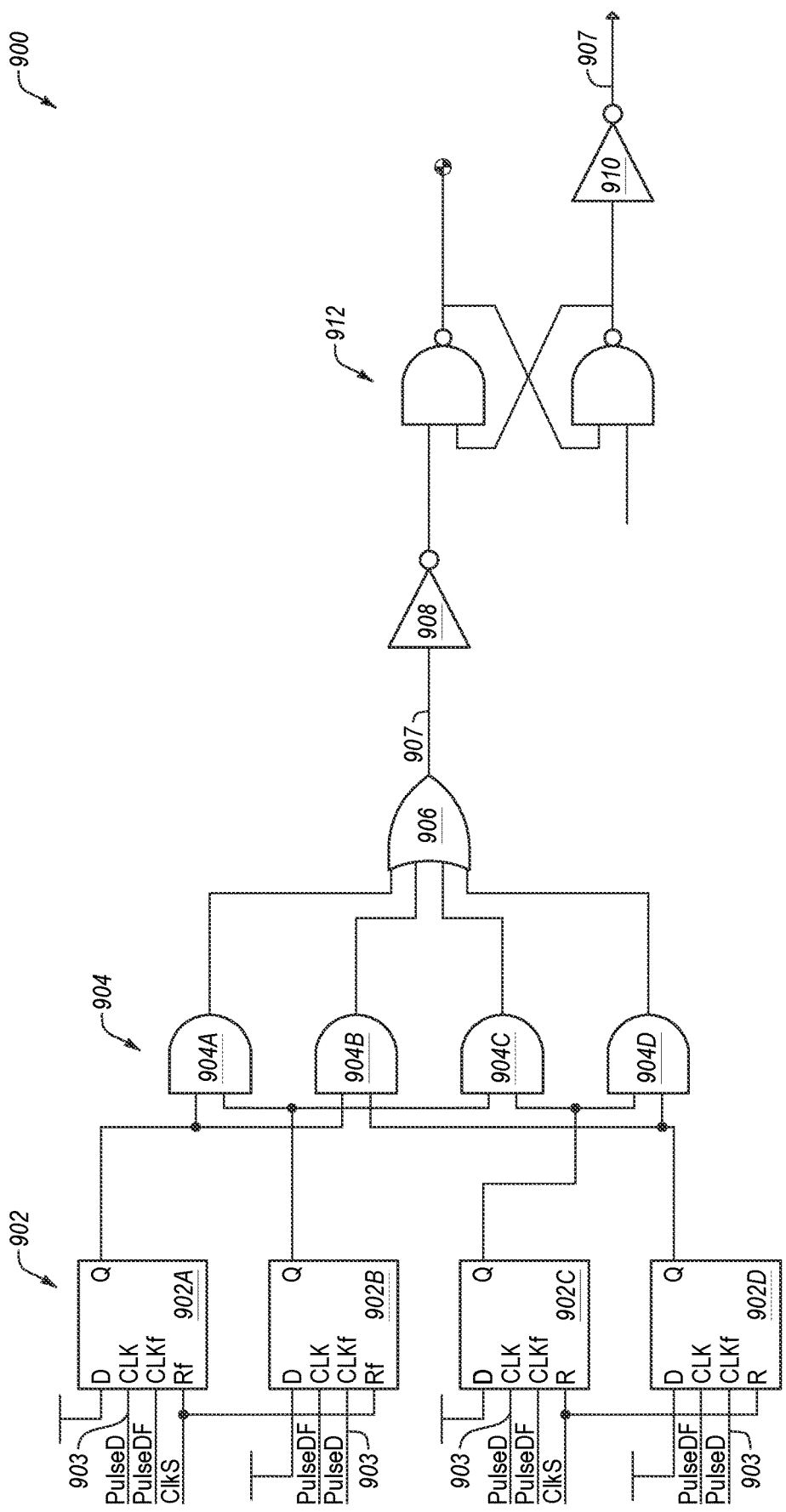
FIG. 9 depicts an example circuit diagram, according to various embodiments of the present disclosure.

FIG. 9 is a circuit diagram 900, in accordance with various embodiments of the present disclosure. Circuit diagram 900 may be an example implantation of device 800 of FIG. 8. Circuit diagram 900 includes a number of flip-flops 902, a number of AND gates 904, an OR gate 906, inverters 908 and 910, and a set/reset (SR) latch 912.

Flip-flop 902A may be configured to generate a HIGH output (i.e., at Q) in response to detecting a rising edge of a test signal ("signal under test") 903 ("PulseD") while a clock signal is HIGH. Further, flip-flop 902B may be configured to generate a HIGH output (i.e., at Q) in response to detecting a falling edge of test signal ("signal under test") 903 ("PulseD") while the clock signal is HIGH. Flip-flop 902C may be configured to generate a HIGH output (i.e., at Q) in response to detecting a rising edge of test signal ("signal under test") 903 ("PulseD") while the clock signal is LOW. In addition, flip-flop 902D may be configured to generate a HIGH output (i.e., at Q) in response to detect a falling edge of test signal ("signal under test") 903 ("PulseD") while the clock signal is LOW.

AND gate 904A is configured to assert a flag in response to detection of a rising edge and a falling edge during the first aperture (e.g., defined by filter 804A of FIG. 8) (i.e., a clock signal is HIGH for both rising and falling edges of signal 903). AND gate 904B is configured to assert a flag in response to detection of a rising edge and a falling edge during the second aperture (e.g., defined by filter 804B of FIG. 8) (i.e., a clock signal is LOW for both rising and falling edges of signal 903). AND gate 904C is configured to assert a flag in response to detection of a rising edge and a falling edge during the third aperture (e.g., defined by filter 804C of FIG. 8) (i.e., a clock signal is HIGH for a rising edge and LOW for a falling edge of signal 903). Further, AND gate 904D is configured to assert a flag in response to detection of a rising edge and a falling edge during the fourth aperture (e.g., defined by filter 804D of FIG. 8) (i.e., a clock signal is LOW for a rising edge of signal 903 and HIGH for a falling edge of signal 903).

OR gate 906 is configured to assert a glitch flag 907 in response to at least one AND gate 904 asserting a flag indicative of a glitch. Further, SR latch 912 is configured to capture glitch flag 907. In some embodiments, SR latch 912 may (e.g., periodically) clear glitch flag 907.

As will be appreciated in view of circuit diagram 900, flip-flops 902 may be used for rising and falling edge detection, and a system clock may be used as a RESET (or as an ENABLE) for setting a timing aperture of flip-flops 902. It is noted that, by using the system clock, timing apertures may scale with a clock period.

It is noted that circuit diagram 900 is provided as an example circuit configuration for carrying out various embodiments of the present disclosure. However, the present disclosure is not limited to circuit diagram 900, and, as will be appreciated by a person having ordinary skill, other circuit configurations may be used to carry out various embodiments of the present disclosure.

As will be appreciated, various embodiments disclosed herein may include and/or utilize additional circuitry to preform various operations. More specifically, for example, additional circuitry may be utilized to condition one or more signals and/or adjust timing of one or more signals. Yet more specifically, a multiplexer (not shown), which may be coupled to a pulse detector (e.g., pulse detector 402) may be used to select a specific test signal. As another example, various buffers and/or delay elements may be used to add and/or increase a delay (e.g., of a signal) and/or align two or more signals (e.g., align a comparison signal (e.g., a clock signal) and a test signal). As yet another example, a clock divider and/or circuitry may be used to clear a flag signal (e.g., after a glitch flag is asserted).

Figure 10:
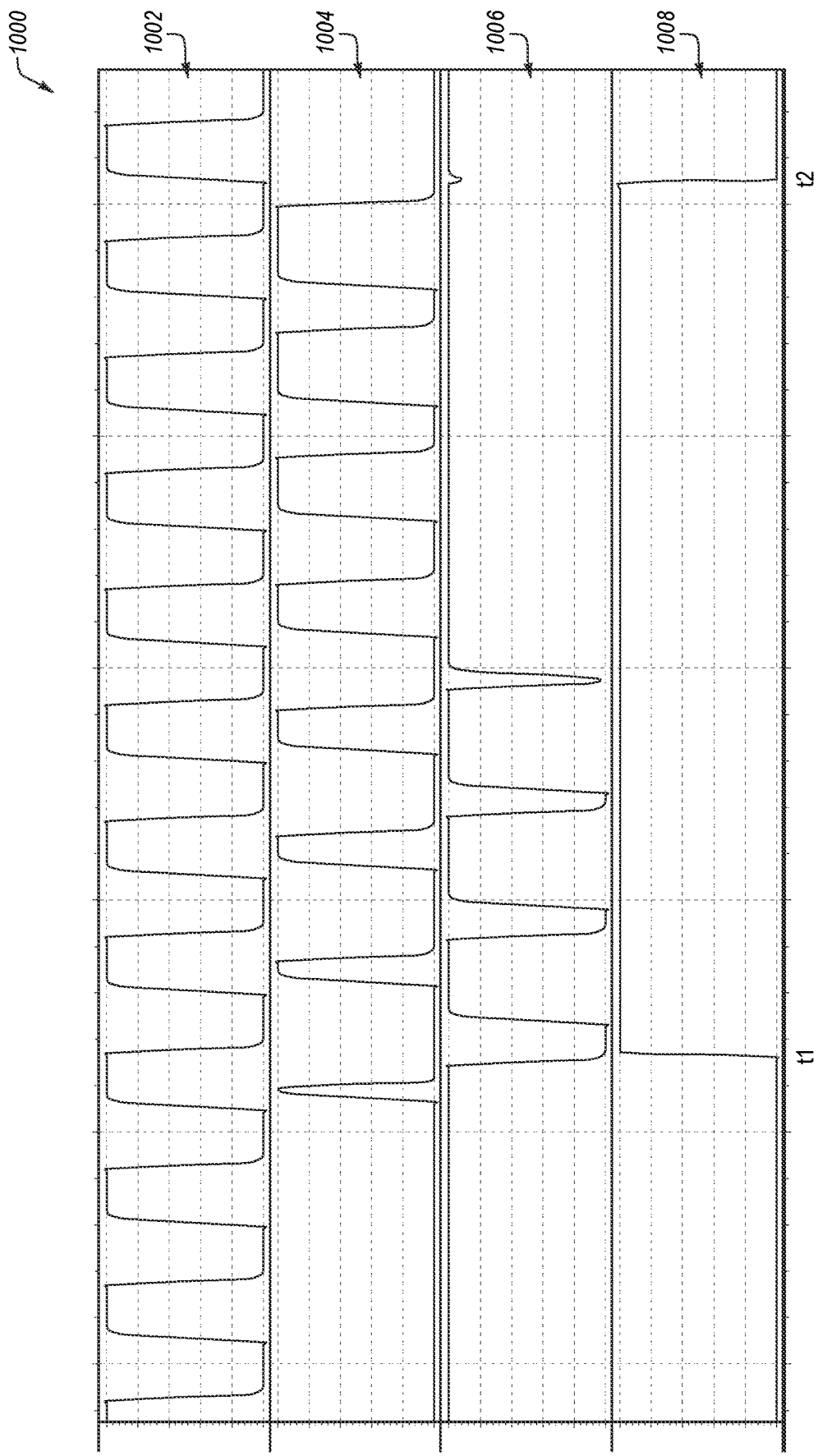
FIGS. 10 and 11 depict plots including a number of signals of a device, in accordance with various embodiments of the present disclosure.
Figure 11:
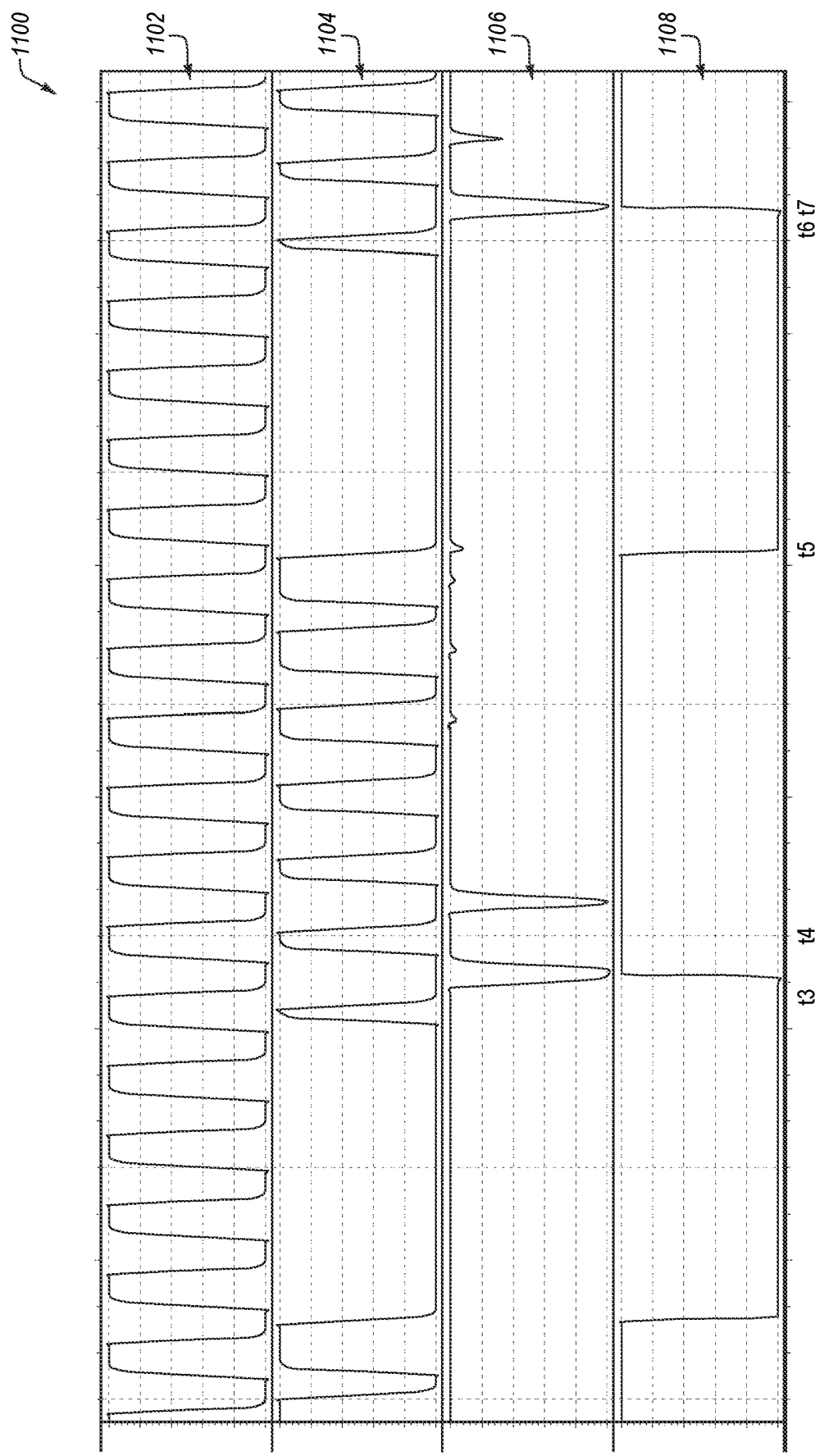

FIGS. 10 and 11 depict plots including a number of signals of a device, in accordance with various embodiments of the present disclosure. With reference to FIG. 10, a plot 1000 includes a clock signal (e.g., a system clock signal) 1002, a test signal 1004, a glitch detect signal 1006, and a glitch flag 1008. As shown in FIG. 10, the first four pulses of test signal 1004 are less than one-fourth of a period of clock signal 1002. Thus, for each the first four pulses of test signal 1004, glitch detect signal 1006 includes a pulse (i.e., a LOW pulse for a negative-going edge detection), and glitch flag 1008 is asserted (i.e., at about time t1). Further, as shown in FIG. 10, glitch flag 1008 is reset (i.e., at about time t2) (e.g., after a full burst of data is read out).

With reference to FIG. 11, a plot 1100 includes a clock signal (e.g., a system clock signal) 1102, a test signal 1104, a glitch detect signal 1106, and a glitch flag 1108. As shown in FIG. 11, at about time t3 and about time t4, a pulse of test signal 1104 is less than one-fourth of a period of clock signal 1102. Thus, for each of these pulses of test signal 1104, glitch detect signal 1106 includes pulse (i.e., a LOW pulse for a negative-going edge detection), and glitch flag 1108 is asserted (i.e., between time t3 and t4). Further, as shown in FIG. 11, glitch flag 1008 is reset (i.e., at about time t5). Further, at about time t6, a pulse of test signal 1104 is less than one-fourth of a period of clock signal 1102, and thus glitch detect signal 1106 includes a pulse (i.e., a LOW pulse for a negative-going edge detection) at about time t7, and glitch flag 1108 is asserted (i.e., at about time t7).

Figure 12:
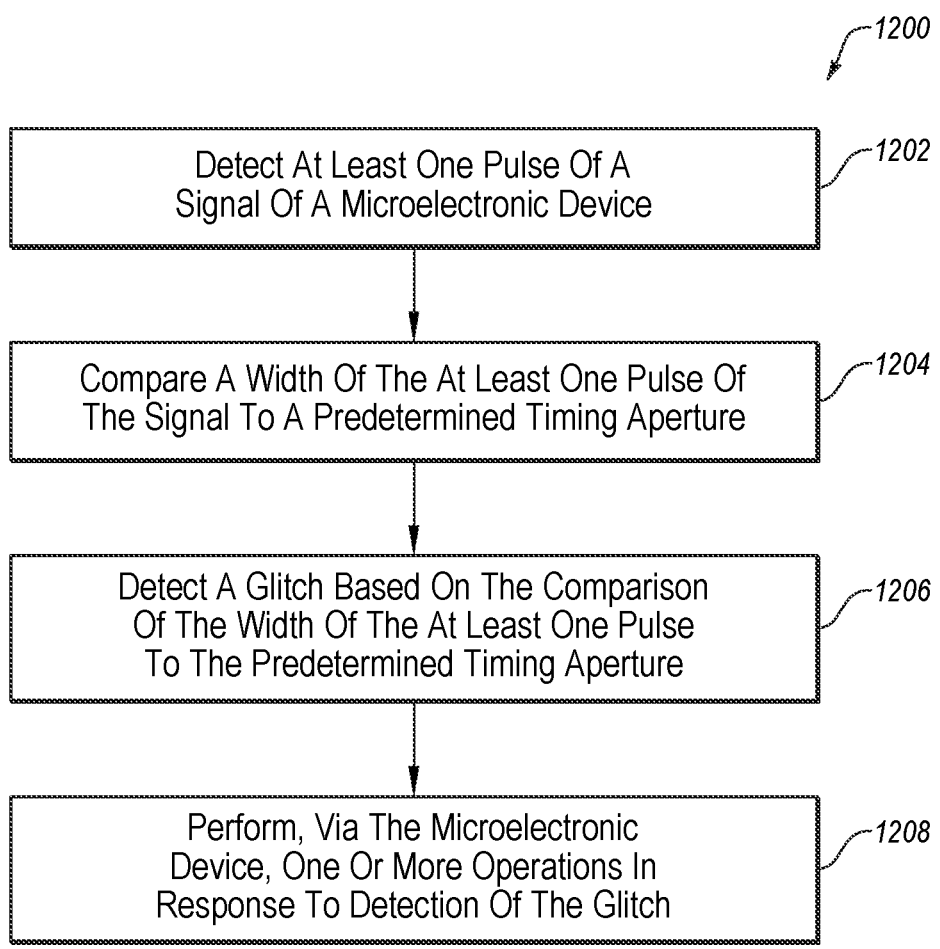
FIG. 12 is a flowchart illustrating an example method of operating a microelectronic device, according to various embodiments of the present disclosure.

FIG. 12 is a flowchart of an example method 1200 of operating a microelectronic device. Method 1200 may be arranged in accordance with at least one embodiment described in the present disclosure. Method 1200 may be performed, in some embodiments, by a device or system, such as memory device 100 of FIG. 1, device 400 of FIG. 4, device 500 of FIG. 5, device 600 of FIG. 6, device 700 of FIG. 7, device 800 of FIG. 8, circuit diagram 900 of FIG. 9, memory system 1300 of FIG. 13, electronic system 1400 of FIG. 14, or another device or system. Although illustrated as discrete blocks, various blocks may be divided into additional blocks, combined into fewer blocks, or eliminated, depending on the desired implementation.

Method 1200 may begin at block 1202, wherein at least one pulse of a signal of a microelectronic circuit may be detected, and method 1200 may proceed to block 1204. For example, the at least one pulse of the signal (e.g., a DQS signal) may be detected via one or more pulse detectors (e.g., pulse detector 402, pulse detector 502, pulse detector 602, pulse detector 702, or pulse detector 802).

At block 1204, a width of the at least one pulse of the signal may be compared to a predetermined timing aperture, and method 1200 may proceed to block 1206. For example, the width of the at least one pulse of the signal may be compared to the predetermined timing aperture via one or more filters (e.g., filter 404, filter 504, filter 604A, filter 604B, filter 704, and filters 804A-804D). For example, the width of the at least one pulse may be compared to a timing signal that defines the predetermined timing aperture. In another example, the width of the at least one pulse may be compared to one or more pulse width thresholds.

At block 1206, in response to the comparison of the width of the at least one pulse to the predetermined timing aperture, a glitch may be detected, and method 1200 may proceed to block 1208. For example, a glitch may be detected in response to the at least one pulse including each of a falling and a rising edge during the predetermined timing aperture. As another example, a glitch may be detected in response to the at least one pulse having a width either greater than an upper threshold width of the timing aperture or less than a lower threshold width of the timing aperture.

At block 1208, one or more operations may be performed in response to detection of the glitch. For example, in response to detection of the glitch, and based on one or more mode register settings of the microelectronic device, one or more read and/or write operations may be enabled and/or disabled.

Modifications, additions, or omissions may be made to method 1200 without departing from the scope of the present disclosure. For example, the operations of method 1200 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, method 1200 may include an operation wherein a timing signal indicative of the predetermined timing aperture is received at one or more filters (e.g., filter 404, filter 504, filter 604A, filter 604B, filter 704, and filters 804A-804D).

A memory system is also disclosed. The memory system may include a number of memory devices. Each memory device may include one or more arrays (e.g., memory arrays) and one or more output drivers, as described herein.

Figure 13:
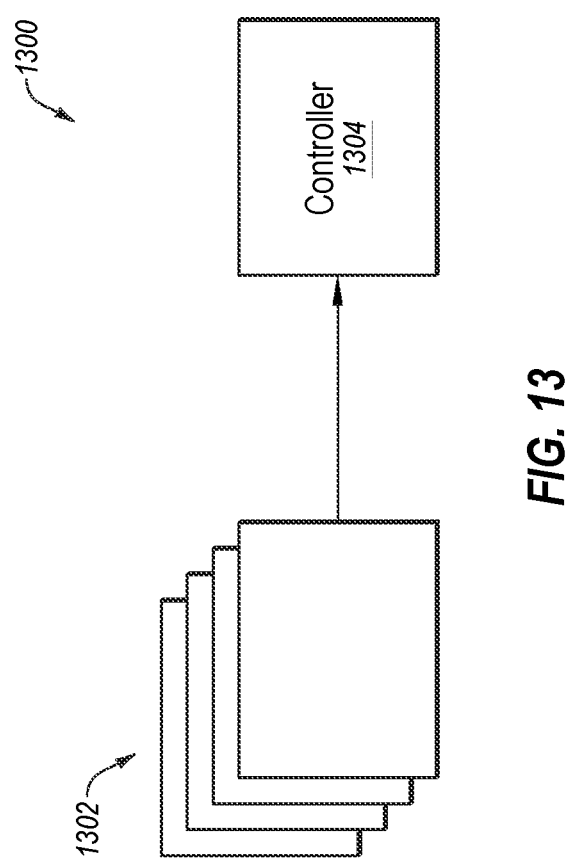
FIG. 13 is a simplified block diagram of an example memory system, according to one or more embodiments of the present disclosure.

FIG. 13 is a simplified block diagram of a memory system 1300 implemented according to one or more embodiments described herein. Memory system 1300 includes a number of memory devices 1302 and a controller 1304. For example, one or more of memory devices 1302 may include a pulse detector, one or more filters, and/or other circuitry for detecting glitches, as described herein. Each memory device 1302, which may include one or more memory cells, may include one or more output driver circuits including one or more unit drivers, as described herein.

Figure 14:
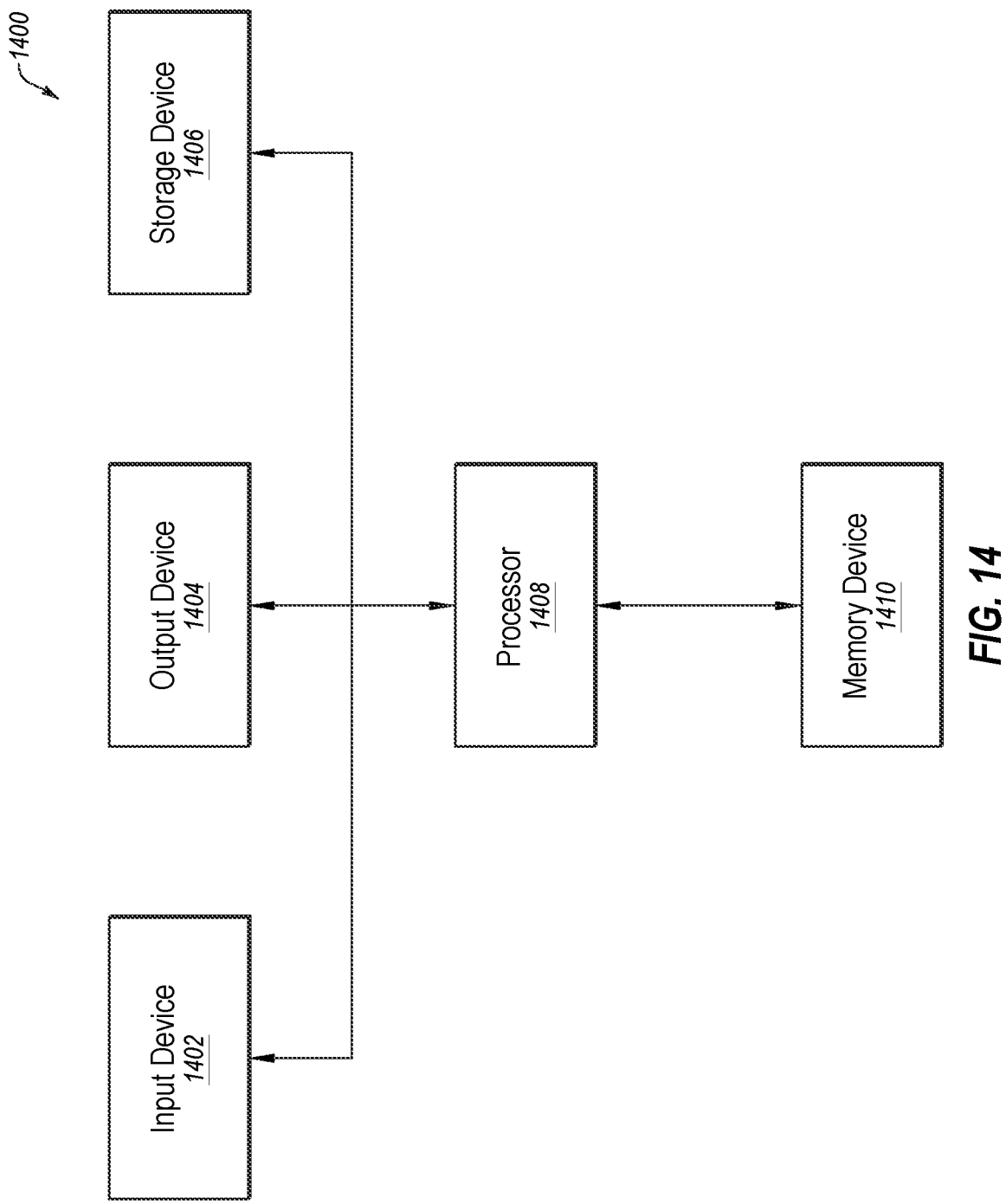
FIG. 14 is a simplified block diagram of an example electronic system, in accordance with one or more embodiments of the present disclosure.

An electronic system is also disclosed. The electronic system may include a memory system including a number of memory devices. FIG. 14 is a simplified block diagram of an electronic system 1400 implemented according to one or more embodiments described herein. Electronic system 1400 includes at least one input device 1402. Input device 1402 may be a keyboard, a mouse, or a touch screen. Electronic system 1400 further includes at least one output device 1404. Output device 1404 may be a monitor, touch screen, or speaker. Input device 1402 and output device 1404 are not necessarily separable from one another. Electronic system 1400 further includes a storage device 1406. Input device 1402, output device 1404, and storage device 1406 are coupled to a processor 1408.

Electronic system 1400 further includes a memory system 1410 coupled to processor 1408. Memory system 1410, which may include memory system 1300 of FIG. 13, includes a number of memory devices (e.g., memory device 100 of FIG. 1). Electronic system 1400 may include a computing, processing, industrial, or consumer product. For example, without limitation, electronic system 1400 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

One or more embodiments of the present disclosure include a device. The device may include a pulse detector configured to detect one or more pulses of a received signal. The device may further include circuitry coupled to the pulse detector and configured to receive one or more captured signals from the pulse detector indicative of a width of the one or more pulses of the received signal. The circuitry may also be configured to compare the width of the one or more pulses of the received signal to a timing aperture defining a range of pulse widths. Further, the circuitry may be configured to generate a signal indicative of a glitch in response to the width of the one or more pulses of the received signal being outside of the range of pulse widths of the timing aperture.

Other embodiments of the present disclosure include a method. The method may include detecting at least one pulse of a signal of a microelectronic device. The method may also include comparing a width of the at least one pulse of the signal to a predetermined timing aperture. Further, the method may include detecting a glitch based on the comparison of the width of the at least one pulse to the predetermined timing aperture. The method may also include performing, via the microelectronic device, one or more operations in response to detection of the glitch.

Additional embodiments of the present disclosure include an electronic system. The electronic system may include at least one input device, at least one output device, at least one processor device operably coupled to the input device and the output device; and at least one memory system operably coupled to the at least one processor device. The memory system may include a memory device. The memory device may include a pulse detector configured to detect a width of a number of pulses of a test signal. The memory device may also include a filter coupled to the pulse detector. The filter may be configured to receive a timing signal defining a timing period. The filter may also be configured to receive a signal indicative of the width of the number of pulses of the test signal. Further, the filter may be configured to compare the width of the number of pulses of the signal to the timing period to detect a glitch. Moreover, the filter may be configured to generate a flag in response to detection of the glitch.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
   circuitry configured to:
   detect a width of one or more pulses of a signal of a microelectronic device; and
   generate a signal indicative of an unacceptable pulse width in response to the width of the one or more pulses of the signal being either less than a first width threshold or greater than a second width threshold.

2. The device of claim 1, wherein the circuitry is further configured to compare the width of the one or more pulses of the signal to a timing aperture defining a range of pulse widths.

3. The device of claim 2, wherein the circuitry is further configured to receive a timing signal that defines the timing aperture.

4. The device of claim 3, wherein the circuitry is further configured to:
   detect a first edge of the signal and generate a first captured signal; and
   detect a second edge of the signal and generate a second captured signal.

5. The device of claim 4, wherein the circuitry is further configured to:
   compare the first captured signal to a first portion of the timing signal;
   compare the second captured signal to a second portion of the timing signal; and
   generate the signal indicative of the unacceptable pulse width in response either the first captured signal or the second captured signal including the unacceptable pulse width.

6. The device of claim 4, wherein the circuitry is further configured to:
   receive the first captured signal and the timing signal;
   generate a first indicator signal in response to the first captured signal rising and falling during a first portion of a true component of the timing signal;
   receive the second captured signal and the timing signal; and
   generate a second indicator signal in response to the second captured signal falling and rising during a second portion of the true component of the timing signal.

7. The device of claim 6, wherein the circuitry is further configured to generate a flag in response to receipt of the first indicator signal or the second indicator signal.

8. The device of claim 6, wherein the circuitry is further configured to:
   receive the first captured signal and the timing signal;
   generate a third indicator signal in response to the first captured signal rising and falling during a first portion of a complement component of the timing signal;
   receive the second captured signal and the timing signal; and
   generate a fourth indicator signal in response to the second captured signal falling and rising during a second portion of the complement component of the timing signal.

9. The device of claim 8, wherein the circuitry is further configured to generate a flag in response to receipt of the first indicator signal, the second indicator signal, the third indicator signal, or the fourth indicator signal.

10. The device of claim 1, wherein the circuitry is further configured to:
    compare the width of the one or more pulses of the signal to a first width threshold, a second width threshold, or both the first width threshold and the second width threshold; and
    generate the signal indicative of the unacceptable pulse width in response to the width of the one or more pulses of the signal being either less than the first width threshold or greater than the second width threshold.

11. A method, comprising:
    detecting at least one pulse of a signal of a microelectronic device; and
    detecting an unacceptable pulse width based on a comparison of a width of the at least one pulse to one or more threshold widths.

12. The method of claim 11, wherein detecting the unacceptable pulse width comprises detecting the unacceptable pulse width in response to the width of the at least one pulse of the signal being either greater than an upper pulse width threshold of a predetermined timing aperture or less than a lower pulse width threshold of the predetermined timing aperture.

13. The method of claim 12, further comprising receiving a timing signal indicative of the predetermined timing aperture.

14. The method of claim 13, wherein receiving the timing signal comprises receiving a pulse or a clock signal.

15. The method of claim 11, wherein detecting the at least one pulse of the signal comprises capturing each of a positive-going pulse and a negative-going pulse of the signal.

16. The method of claim 11, further comprising performing one or more operations in response to detection of the unacceptable pulse width.

17. A system, comprising:
    at least one input device;
    at least one output device;
    at least one processor device operably coupled to the input device and the output device; and
    at least one memory system operably coupled to the at least one processor device, the at least one memory system comprising a memory device including circuitry configured to:

detect a width of a number of pulses of a test signal of the memory device; and generate a flag in response to the width of at least one pulse of the number of pulses being unacceptable.

18. The system of claim 17, the circuitry further including a number of flip-flops, wherein each flip-flop of the number of flip-flops is configured to detect the width of the number of pulses of the test signal.

19. The system of claim 18, wherein the circuitry further comprises a number of AND gates, each AND gate of the number of AND gates configured to receive signals from two flip-flops of the number of flip-flops.

20. The system of claim 17, the memory device further comprising one or more mode registers, wherein one or more settings of the one or more mode registers is used to define one or more operations to be performed in response to the flag.

* * * * *

UNITED STATES PATENT AND TRADEMARK OFFICE
CERTIFICATE OF CORRECTION

PATENT NO. : 12,154,645 B2  
APPLICATION NO. : 18/363587  
DATED : November 26, 2024  
INVENTOR(S) : Linh H. Nguyen et al.

Page 1 of 1

It is certified that error appears in the above-identified patent and that said Letters Patent is hereby corrected as shown below:

In the Specification

| | | |
|---|---|---|
| Column 4, | Line 55, | change "read/write signal RAY." to --read/write signal R/W.-- |
| Column 5, | Line 4, | change "Read/write signal RAY may include" to --Read/write signal R/W may include-- |

Signed and Sealed this  
Twenty-first Day of January, 2025

Coke Morgan Stewart  
*Acting Director of the United States Patent and Trademark Office*